United States Patent
Kemper et al.

(10) Patent No.: US 7,701,550 B2
(45) Date of Patent: Apr. 20, 2010

(54) LITHOGRAPHIC APPARATUS AND DEVICE MANUFACTURING METHOD

(75) Inventors: Nicolaas Rudolf Kemper, Eindhoven (NL); Henrikus Herman Marie Cox, Eindhoven (NL); Sjoerd Nicolaas Lambertus Donders, Vught (NL); Roelof Frederik De Graaf, Veldhoven (NL); Christiaan Alexander Hoogendam, Westerhoven (NL); Nicolaas Ten Kate, Almkerk (NL); Jeroen Johannes Sophia Maria Mertens, Duizel (NL); Frits Van Der Meulen, Eindhoven (NL); Franciscus Johannes Herman Maria Teunissen, Rotterdam (NL); Jan-Gerard Cornelis Van Der Toorn, Eindhoven (NL); Martinus Cornelis Maria Verhagen, Valkenswaard (NL); Stefan Philip Christiaan Belfroid, Delft (NL); Johannes Petrus Maria Smeulers, Zwijndrecht (NL); Herman Vogel, Sandy Hook, CT (US)

(73) Assignees: ASML Netherlands B.V., Veldhoven (NL); ASML Holding NV, Veldhoven (NL)

( * ) Notice: Subject to any disclaimer, the term of this patent is extended or adjusted under 35 U.S.C. 154(b) by 1475 days.

(21) Appl. No.: 10/921,348

(22) Filed: Aug. 19, 2004

(65) Prior Publication Data

US 2006/0038968 A1 Feb. 23, 2006

(51) Int. Cl.
*G03B 27/42* (2006.01)
*G03B 27/52* (2006.01)

(52) U.S. Cl. .......................... 355/53; 355/30

(58) Field of Classification Search ............... 355/53, 355/67, 71, 30; 378/34, 35; 250/548
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 4,729,932 A | 3/1988 | McElroy | 429/34 |

(Continued)

FOREIGN PATENT DOCUMENTS

CN 1 501 173 A 6/2004

(Continued)

OTHER PUBLICATIONS

Duineveld et al., U.S. Appl. No. 10/773,461, filed Feb. 9, 2004.

(Continued)

*Primary Examiner*—Hung Henry Nguyen
(74) *Attorney, Agent, or Firm*—Pillsbury Winthrop Shaw Pittman, LLP

(57) ABSTRACT

A porous member is used in a liquid removal system of an immersion lithographic projection apparatus to smooth uneven flows. A pressure differential across the porous member may be maintained at below the bubble point of the porous member so that a single-phase liquid flow is obtained. Alternatively, the porous member may be used to reduce unevenness in a two-phase flow.

42 Claims, 6 Drawing Sheets

U.S. PATENT DOCUMENTS

| | | | |
|---|---|---|---|
| 5,040,020 A | 8/1991 | Rauschenbach et al. | 355/53 |
| 5,107,757 A | 4/1992 | Ohshita et al. | 100/90 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | |
| 6,236,634 B1 | 5/2001 | Lee et al. | 369/112 |
| 6,262,796 B1 | 7/2001 | Loopstra et al. | |
| 6,341,007 B1 | 1/2002 | Nishi et al. | |
| 6,560,032 B2 | 5/2003 | Hatano | 359/656 |
| 6,600,547 B2 | 7/2003 | Watson et al. | |
| 6,603,130 B1 | 8/2003 | Bisschops et al. | 250/492.1 |
| 6,633,365 B2 | 10/2003 | Suenaga | 355/53 |
| 6,781,670 B2 | 8/2004 | Krautschik | |
| 6,788,477 B2 | 9/2004 | Lin | |
| 6,988,327 B2 | 1/2006 | Garcia et al. | |
| 7,292,313 B2 | 11/2007 | Poon et al. | 355/53 |
| 7,339,650 B2 * | 3/2008 | Coon et al. | 355/30 |
| 2002/0020821 A1 | 2/2002 | Van Santen et al. | 250/492 |
| 2002/0163629 A1 | 11/2002 | Switkes et al. | 355/53 |
| 2003/0030916 A1 | 2/2003 | Suenaga | |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0118184 A1 | 6/2004 | Violette | |
| 2004/0119954 A1 | 6/2004 | Kawashima et al. | 355/30 |
| 2004/0125351 A1 | 7/2004 | Krautschik et al. | 355/53 |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | 355/30 |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0239954 A1 | 12/2004 | Bischoff | 356/635 |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | 355/30 |
| 2005/0002004 A1 | 1/2005 | Kolesynchenko et al. | |
| 2005/0007569 A1 | 1/2005 | Streefkerk et al. | 355/30 |
| 2005/0007570 A1 | 1/2005 | Streefkerk et al. | |
| 2005/0018155 A1 | 1/2005 | Cox et al. | 355/30 |
| 2005/0018156 A1 | 1/2005 | Mulkens et al. | |
| 2005/0024609 A1 | 2/2005 | De Smit et al. | 355/18 |
| 2005/0030497 A1 | 2/2005 | Nakamura | 355/30 |
| 2005/0030498 A1 | 2/2005 | Mulkens | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | 355/30 |
| 2005/0046934 A1 | 3/2005 | Ho et al. | 359/380 |
| 2005/0048223 A1 | 3/2005 | Pawloski et al. | |
| 2005/0052632 A1 | 3/2005 | Miyajima | 355/53 |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | 355/53 |
| 2005/0094125 A1 | 5/2005 | Arai | 355/72 |
| 2005/0100745 A1 | 5/2005 | Lin et al. | |
| 2005/0117224 A1 | 6/2005 | Shafer et al. | |
| 2005/0122497 A1 | 6/2005 | Lyons et al. | |
| 2005/0122505 A1 | 6/2005 | Miyajima | 355/72 |
| 2005/0134817 A1 | 6/2005 | Nakamura | |
| 2005/0140948 A1 | 6/2005 | Tokita | 355/30 |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146693 A1 | 7/2005 | Ohsaki | 355/30 |
| 2005/0146694 A1 | 7/2005 | Tokita | 355/30 |
| 2005/0146695 A1 | 7/2005 | Kawakami | |
| 2005/0147920 A1 | 7/2005 | Lin et al. | |
| 2005/0151942 A1 | 7/2005 | Kawashima | 355/30 |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0200815 A1 | 9/2005 | Akamatsu | 353/53 |
| 2005/0205108 A1 | 9/2005 | Chang et al. | |
| 2005/0213061 A1 | 9/2005 | Hakey et al. | |
| 2005/0213065 A1 | 9/2005 | Kitaoka | 355/53 |
| 2005/0213066 A1 | 9/2005 | Sumiyoshi | 355/53 |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219489 A1 | 10/2005 | Nei et al. | 355/53 |
| 2005/0219499 A1 | 10/2005 | Zaal et al. | |
| 2005/0225737 A1 | 10/2005 | Weissenrieder et al. | |
| 2005/0231694 A1 | 10/2005 | Kolesynchenko et al. | |
| 2005/0233081 A1 | 10/2005 | Tokita | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0263068 A1 | 12/2005 | Hoogendam et al. | 118/668 |
| 2005/0264778 A1 | 12/2005 | Lof et al. | |
| 2005/0270505 A1 | 12/2005 | Smith | |
| 2005/0282405 A1 | 12/2005 | Harpham et al. | |
| 2006/0038968 A1 | 2/2006 | Kemper et al. | |
| 2006/0087630 A1 | 4/2006 | Kemper et al. | |
| 2006/0158627 A1 | 7/2006 | Kemper et al. | 355/53 |
| 2007/0139631 A1 * | 6/2007 | Novak et al. | 355/53 |
| 2007/0195303 A1 * | 8/2007 | Poon et al. | 355/53 |
| 2007/0242241 A1 | 10/2007 | Nagasaka et al. | 355/30 |
| 2008/0084546 A1 | 4/2008 | Owa et al. | 355/30 |

FOREIGN PATENT DOCUMENTS

| | | |
|---|---|---|
| DE | 206 607 | 2/1984 |
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| EP | 1 431 710 A2 | 6/2004 |
| EP | 1 429 188 A3 | 10/2004 |
| EP | 1 571 695 A1 | 9/2005 |
| EP | 1 612 850 A1 | 1/2006 |
| FR | 2474708 | 7/1981 |
| JP | 57-153433 | 9/1982 |
| JP | 58-189018 | 11/1983 |

| | | |
|---|---|---|
| JP | 58-202448 | 11/1983 |
| JP | 59-019912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 05-062877 | 3/1993 |
| JP | 06-124873 | 5/1994 |
| JP | 07-132262 | 5/1995 |
| JP | 07-220990 | 8/1995 |
| JP | 08-316125 | 11/1996 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-207711 A | 7/2004 |
| JP | 2003-185389 A | 1/2005 |
| JP | 2005-085789 | 3/2005 |
| JP | 2005-191344 A | 7/2005 |
| JP | 2005-217188 A | 8/2005 |
| JP | 2006-525323 A | 11/2006 |
| TW | 200525303 A | 8/2005 |
| WO | WO 99/49504 | 9/1999 |
| WO | WO 02/091078 A1 | 11/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO2004/086468 | 10/2004 |
| WO | WO 2004/090577 | 10/2004 |
| WO | WO 2004/090633 | 10/2004 |
| WO | WO 2004/090634 A2 | 10/2004 |
| WO | WO2004/090956 | 10/2004 |
| WO | WO 2004/092830 | 10/2004 |
| WO | WO 2004/092833 A2 | 10/2004 |
| WO | WO 2004/092833 A3 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/024517 A3 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | 2005/071717 A1 | 8/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Flagello et al., U.S. Appl. No. 10/698,012, filed Oct. 31, 2003.
De Smit et al., U.S. Appl. No. 10/705,804, filed Nov. 12, 2003.
Lof et al., U.S. Appl. No. 10/705,805, filed Nov. 12, 2003.
Lof et al., U.S. Appl. No. 10/705,783, filed Nov. 12, 2003.
Van Santen et al., U.S. Appl. No. 10/743,271, filed Dec. 23, 2003.
Mulkens et al., U.S. Appl. No. 10/743,266, filed Dec. 23, 2003.
Derksen et al., U.S. Appl. No. 10/705,785, filed Nov. 12, 2003.
Simon et al., U.S. Appl. No. 10/724,402, filed Dec. 1, 2003.
Bleeker, U.S. Appl. No. 10/715,116, filed Nov. 18, 2003.
Streefkerk et al., U.S. Appl. No. 10/719,683, filed Nov. 24, 2003.
Lof et al., U.S. Appl. No. 10/705,816, filed Nov. 12, 2003.
Dierichs, U.S. Appl. No. 10/775,326, filed Feb. 11, 2004.
M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Office Action for Korean Patent Application No. 10-2005-0076451, dated Sep. 29, 2006.

European Search Report issued for Application No. EP 05254920.1-2222, dated Jan. 30, 2006.

European Official Action issued for European Patent Application No. 05254920.1-2222, dated Mar. 21, 2007.

San et al., "Dewatering Testing of a Ceramic Capillary Filter Produced from a High Silica-Containing Glaze," Key Engineering Materials, vols. 264-268 (2004), pp. 2223-2226.

San, "Microstructural Characterization of Capillary Filter Produced from a High Silica-Containing Glaze," Elsevier Science B.V., Materials Letters 57 (2003) 2189-2192.

European Search Report issued for European Patent Application No. 07000192, dated Mar. 16, 2007.

Information Disclosure Statement filed Feb. 10, 2006 for U.S. Appl. No. 11/350,937.

Office Action dated Feb. 9, 2007 issued for U.S. Appl. No. 11/350,937.

Emerging Lithographic Technologies VI, Proceedings of SPIE, vol. 4688 (2002), Semiconductor Foundry, Lithography and Partners, B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Optical Microlithography XVI, Proceedings of SPIE vol. 5040 (2003), "Immersion lithography; its potential performance and issues", Soichi Owa et al., pp. 724-733.

Office Action dated Jul. 24, 2007 issued for U.S. Appl. No. 11/705,001.

Information Disclosure Statement filed Feb. 12, 2007 for U.S. Appl. No. 11/705,001.

Information Disclosure Statement filed Apr. 24, 2007 for U.S. Appl. No. 11/790,233.

Notice of Allowance issued Oct. 30, 2007 for U.S. Appl. No. 11/705,001.

Notice of Reasons for Rejection for Japanese Patent Application No. 2005-237216 dated Jul. 15, 2008.

English Translation of Taiwanese Official Action issued on Nov. 19, 2008 in Taiwanese Application No. 094127050.

\* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperature (NA) of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In the immersion lithography arrangements described herein, removal of an immersion liquid typically involves a two-phase flow—the immersion liquid mixes with ambient gas (e.g., air) or gas from a gas seal used to confine the immersion liquid. Such a two-phase flow is not very stable, especially when large pressure differentials are used to create strong gas flows to confine the immersion liquid or to ensure that all liquid is collected, and the resulting vibration is undesirable. High pressure gas flows may also cause evaporative drying of liquid remaining on the substrate leading to thermal gradients. Gas flows spilling over into the path of interferometer beams may also affect the accuracy of substrate table position measurements because the interferometer is very sensitive to changes in the refractive index of the gas in the path of the interferometer beams, such as may be caused by changes in temperature, pressure and humidity.

Accordingly, it would be advantageous, for example, to provide an arrangement to remove liquid from the vicinity of the substrate effectively and without generating significant vibration or other disturbances.

According to an aspect of the invention, there is provided a lithographic projection apparatus arranged to project a pattern from a patterning device onto a substrate using a projection system and having a liquid supply system arranged to supply a liquid to a space between the projection system and the substrate, comprising a liquid removal system including:

a conduit having an open end adjacent a volume in which liquid may be present;

a porous member between the end of the conduit and the volume; and a suction device arranged to create a pressure differential across the porous member.

According to an aspect of the invention, there is provided a device manufacturing method, comprising:

projecting a patterned beam of radiation through a liquid onto a substrate using a projection system; and removing liquid from a volume by providing a pressure differential across a porous member bounding at least in part the volume.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
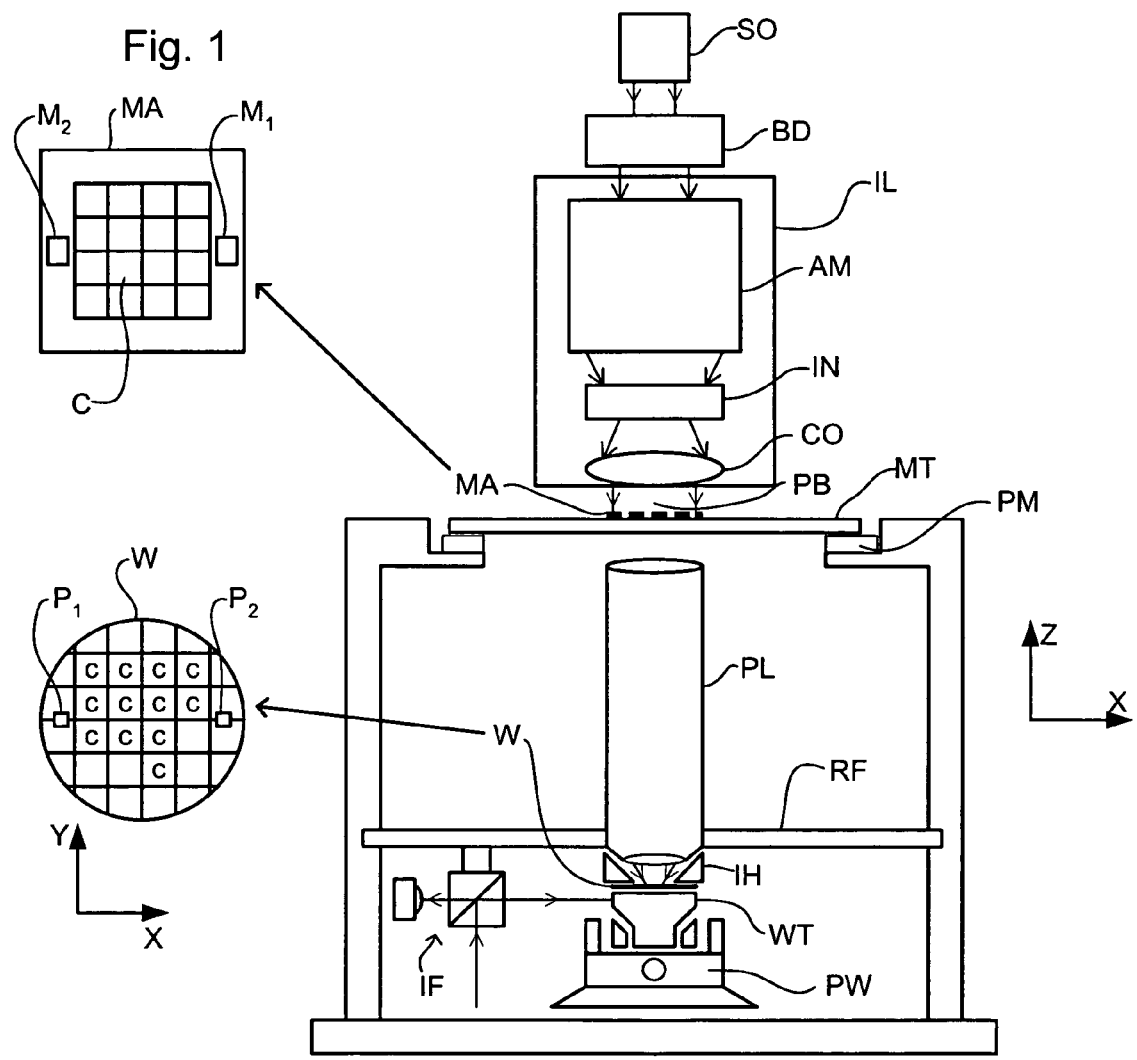
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
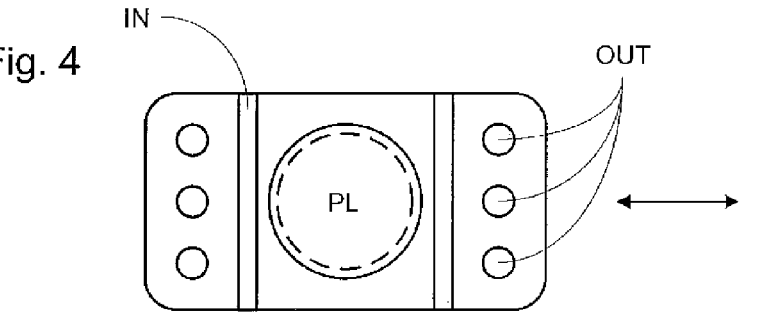
FIG. 4 depicts another liquid supply system for use in a lithographic projection apparatus.
Figure 4:
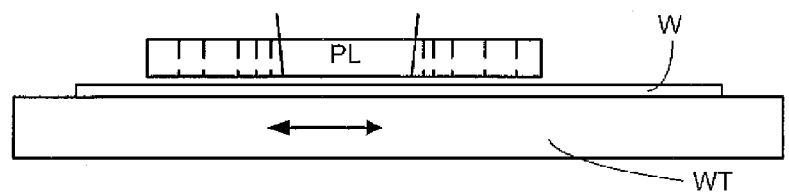

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
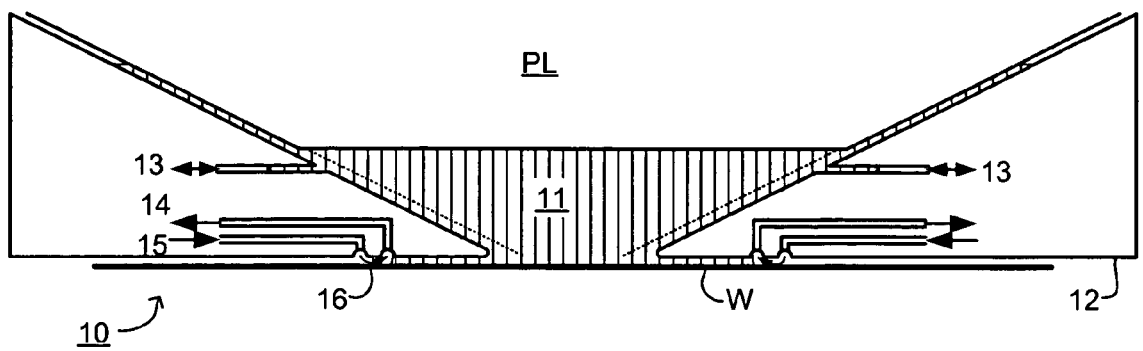
FIG. 5 depicts another liquid supply system for use in a lithographic projection apparatus.

Another immersion lithography solution with a localized liquid supply system solution which has been proposed is to provide the liquid supply system with a seal member which extends along at least a part of a boundary of the space between the final element of the projection system and the substrate table. Such a solution is illustrated in FIG. 5. The seal member is substantially stationary relative to the projection system in the XY plane though there may be some relative movement in the Z direction (in the direction of the optical axis). A seal is formed between the seal member and the surface of the substrate.

Referring to FIG. 5, reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air but, in an embodiment, $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in U.S. patent application Ser. No. 10/705,783, hereby incorporated in its entirety by reference.

Figure 6:
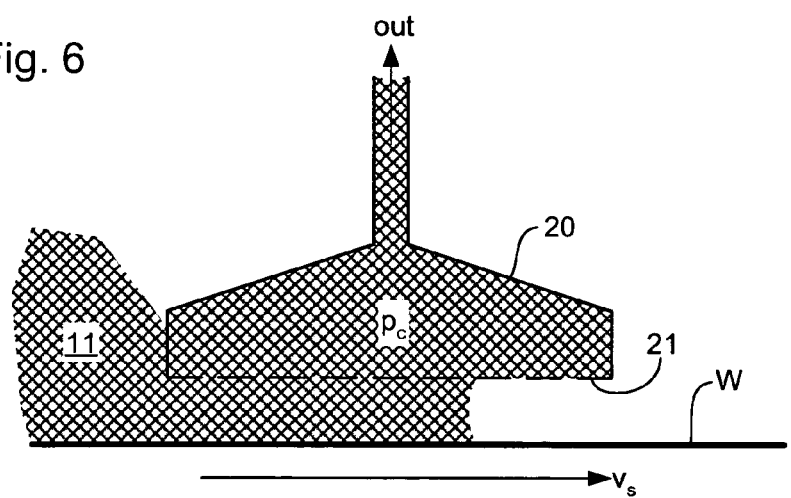
FIG. 6 depicts a liquid removal device according to a particular embodiment of the invention.
Figure 7:
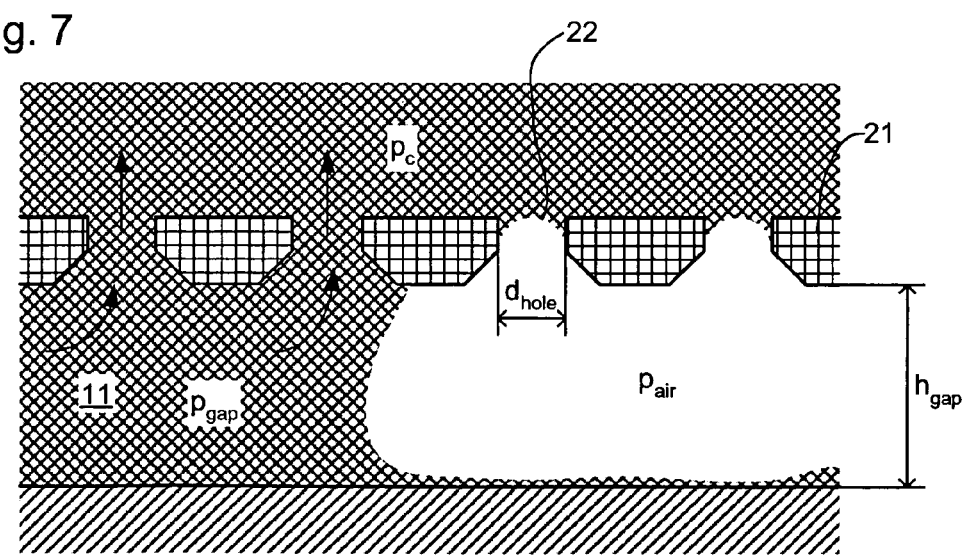
FIG. 7 is an enlarged view of part of FIG. 6.

FIGS. 6 and 7, the latter of which is an enlarged view of part of the former, illustrate a liquid removal device 20 according to an embodiment of the invention. The liquid removal device 20 comprises a chamber which is maintained at a slight underpressure $p_c$ and is filled with the immersion liquid. The lower surface of the chamber is formed of a thin plate 21 having a large number of small holes, e.g. of diameter $d_{hole}$ in the range of 5 to 50 µm, and is maintained at a height $h_{gap}$ in the range of 50 to 300 µm above a surface from which liquid is to be removed, e.g. the surface of a substrate W. In an embodiment, perforated plate 21 is at least slightly hydrophilic, i.e. having a contact angle of less than 90° to the immersion liquid, e.g. water.

The underpressure $p_c$ is such that the menisci 22 formed in the holes in the perforated plate 21 prevent gas being drawn into the chamber of the liquid removal device. However, when the plate 21 comes into contact with liquid on the surface W there is no meniscus to restrict flow and the liquid can flow freely into the chamber of the liquid removal device.

Such a device can remove most of the liquid from the surface of a substrate W, though a thin film of liquid may remain, as shown in the drawings.

To improve or maximize liquid removal, the perforated plate 21 should be as thin as possible and the pressure differential between the pressure in the liquid $p_{gap}$ and the pressure in the chamber $p_c$ should be as high as possible, whilst the pressure differential between $p_c$ and the pressure in the gas in the gap $p_{air}$ must be low enough to prevent significant amounts of gas being drawn into the liquid removal device 20. It may not always be possible to prevent gas being drawn into the liquid removal device but the perforated plate will prevent large uneven flows that may cause vibration. Micro-sieves made by electroforming, photoetching and/or laser cutting can be used as the plate 21. Suitable sieves are made by Stork Veco B. V., of Eerbeek, the Netherlands.

Figure 8:
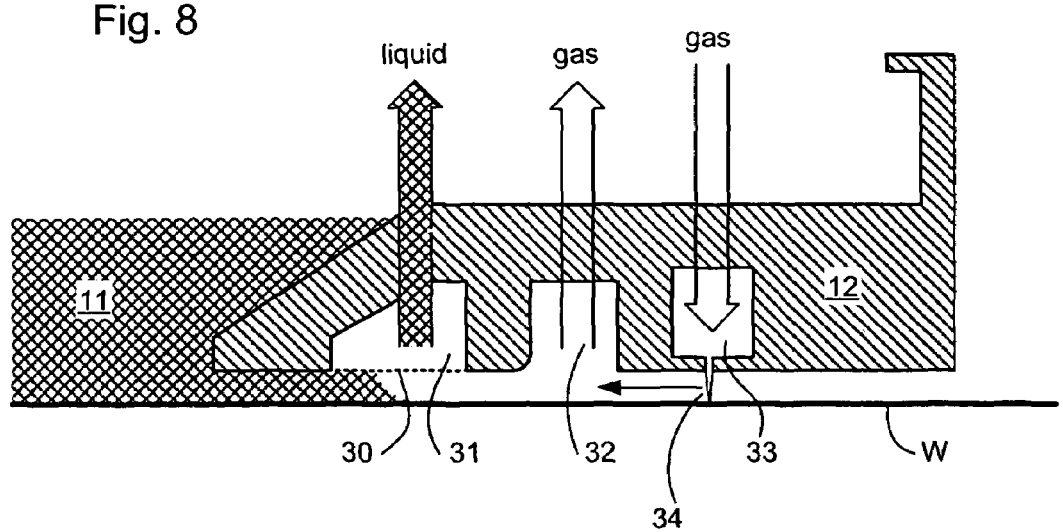
FIG. 8 depicts a liquid supply and removal system according to a particular embodiment of the invention.

FIG. 8 shows a liquid removal device incorporated in a seal member 12 of and immersion hood IH, according to a particular embodiment of the invention. FIG. 8 is a cross-sectional view of one side of the seal member 12, which forms a ring (as used herein, a ring may be circular, rectangular or any other shape) at least partially around the exposure field of the projection system PL (not shown in FIG. 8). In this embodiment, the liquid removal device 20 is formed by a ring-shaped chamber 31 near the innermost edge of the underside of the seal member 12. The lower surface of the chamber 31 is formed by a porous plate 30, as described above. Ring-shaped chamber 31 is connected to a suitable pump or pumps to remove liquid from the chamber and maintain the desired underpressure. In use, the chamber 31 is full of liquid but is shown empty here for clarity.

Outward of the ring-shaped chamber 31 are a gas extraction ring 32 and a gas supply ring 33. The gas supply ring 33 has a narrow slit in its lower part and is supplied with gas, e.g. air, artificial air or flushing gas, at a pressure such that the gas escaping out of the slit forms a gas knife 34. The gas forming the gas knife is extracted by suitable vacuum pumps connected to the gas extraction ring 32 so that the resulting gas flow drives any residual liquid inwardly where it can be removed by the liquid removal device and/or the vacuum pumps, which should be able to tolerate vapor of the immersion liquid and/or small liquid droplets. However, since the majority of the liquid is removed by the liquid removal device 20, the small amount of liquid removed via the vacuum system does not cause unstable flows which may lead to vibration.

Figure 2:
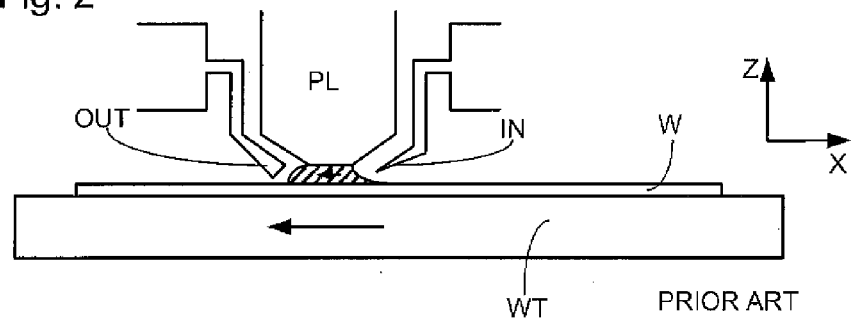
FIGS. 2 and 3 depict a liquid supply system for use in a lithographic projection apparatus.
Figure 3:
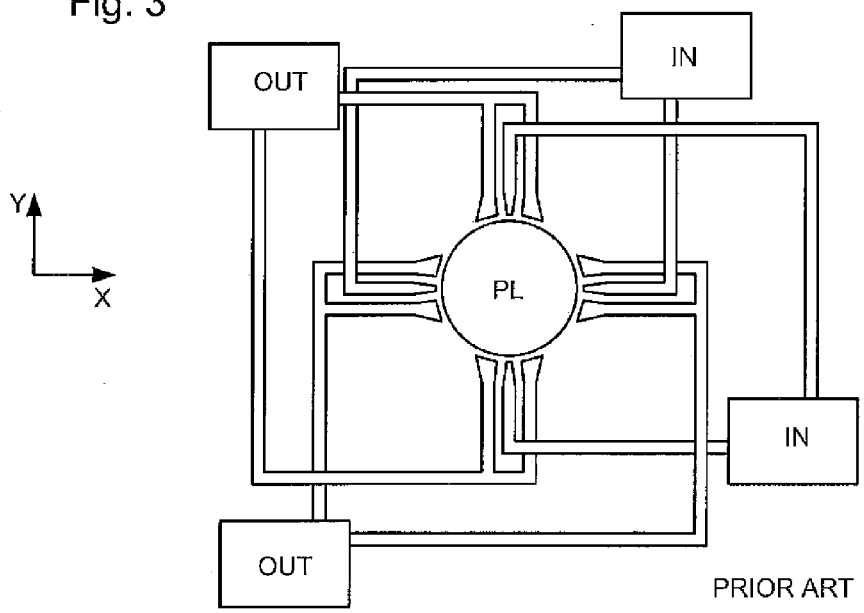

While the chamber 31, gas extraction ring 32, gas supply ring 33 and other rings are described as rings herein, it is not necessary that they surround the exposure field or be complete. In an embodiment, such inlet(s) and outlet(s) may simply be circular, rectangular or other type of elements extending partially along one or more sides of the exposure field, such as for example, shown in FIGS. 2, 3 and 4.

Figure 8A:
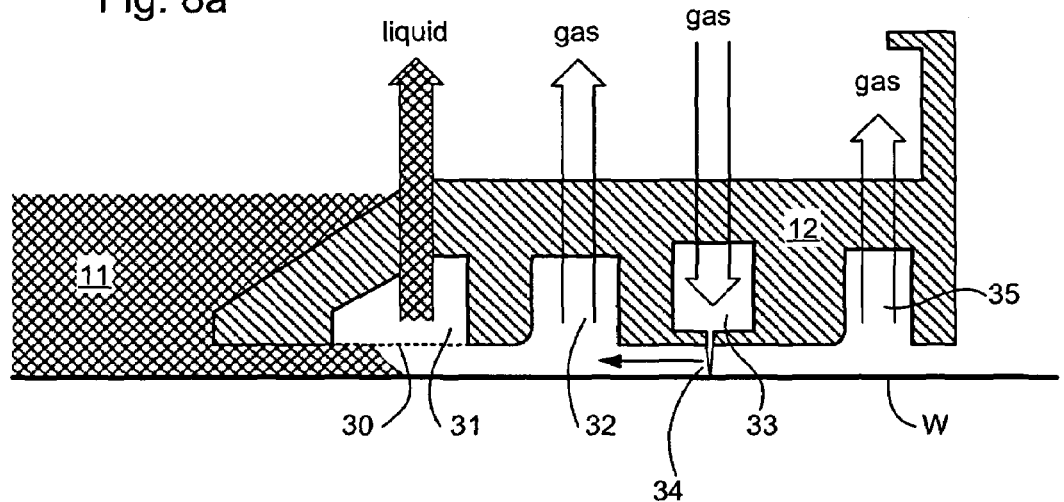
FIG. 8a depicts a variant of the liquid supply and removal system of FIG. 8.

In the apparatus shown in FIG. 8, most of the gas that forms the gas knife is extracted via gas extraction ring 32, but some gas may flow into the environment around the immersion hood and potentially disturb the interferometric position measuring system IF. This can be prevented by the provision of an additional gas extraction ring 35 outside the gas knife, as shown in FIG. 8A.

Because in this embodiment, the liquid removal system can remove most, if not all, of the immersion liquid while at a height of 50 to 300 µm above the surface of the substrate W or the substrate table WT, less onerous requirements are put on the seal member vertical position than when a gas bearing is used to confine the immersion liquid. This means that the seal member may be positioned vertically with a simpler actuation and control system. It also means that the requirements on the flatness of the substrate table and substrate are reduced, making it easier to construct devices such as sensors which need to be provided in the upper surface of the substrate table WT.

Removal of most of the liquid without evaporation also means that temperature gradients may be reduced, avoiding thermal deformation of the substrate, which can lead to printing errors. Evaporation may also be further minimized by using humid gas in the gas knife, e.g. with a relative humidity of about 50 to 75%, in combination with a pressure drop of about 100 to 500 mbar and a flow rate of about 20 to 200 l/min.

Figure 9:
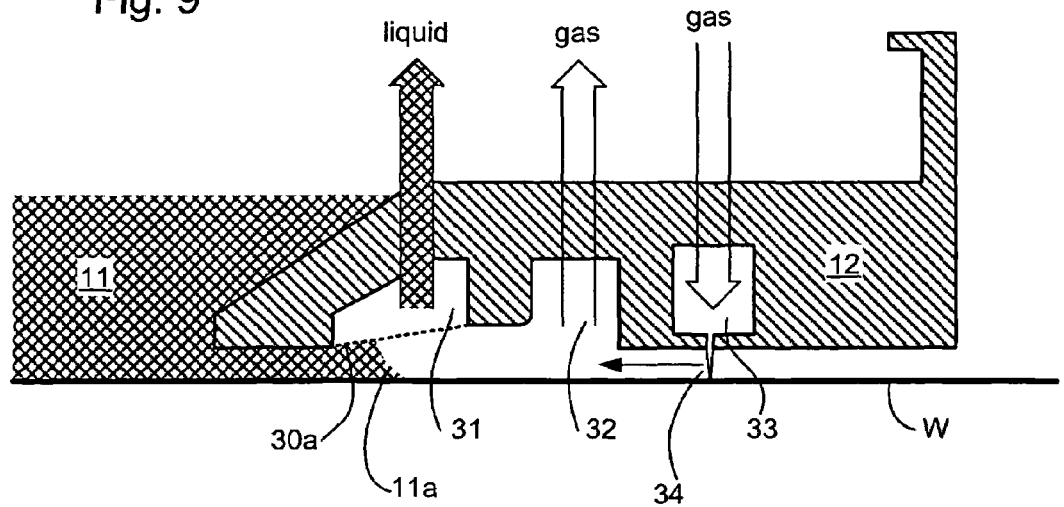
FIG. 9 depicts a variant of the liquid supply and removal system of FIG. 8.
Figure 10:
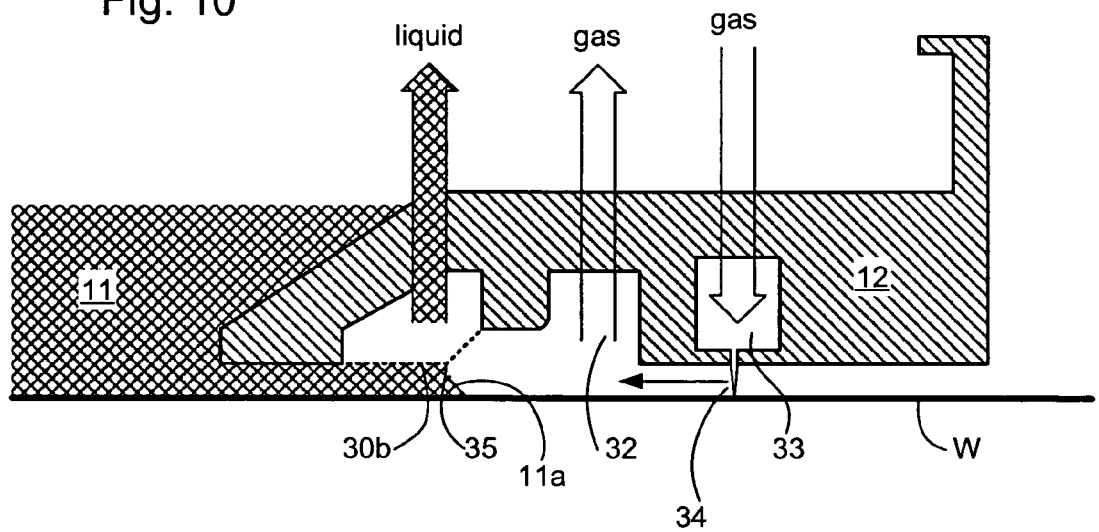
FIG. 10 depicts another variant of the liquid supply and removal system of FIG. 8.
Figure 11:
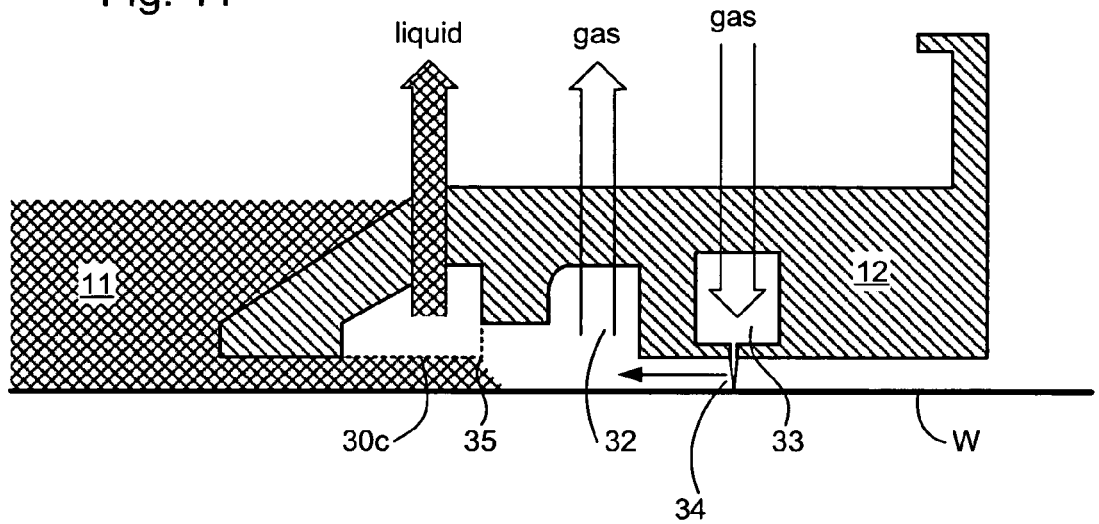
FIG. 11 depicts still another variant of the liquid supply and removal system of FIG. 8.

Variants of this embodiment of the invention are shown in FIGS. 9 to 11. These variants are the same as that described above except in relation to the shape of the porous plate 30.

As shown in FIG. 9, the porous plate 30a can be set at a slight angle, so that it is higher at the outside. The increasing gap between the porous plate 30a and substrate W or substrate table WT with distance from the center of the exposure field, changes the shape of the meniscus 11a and helps to ensure that the area that is immersed in liquid has a more or less constant width.

In the variants shown in FIGS. 10 and 11, sharp corners 35 are used to limit the position of the meniscus 11a which is held by surface tension at the sharp corner. The sharp corner can be an obtuse angle, as shown in FIG. 10, or a right angle, as shown in FIG. 11. The shape of the gas extraction ring 32 can be adjusted as necessary.

Figure 12:
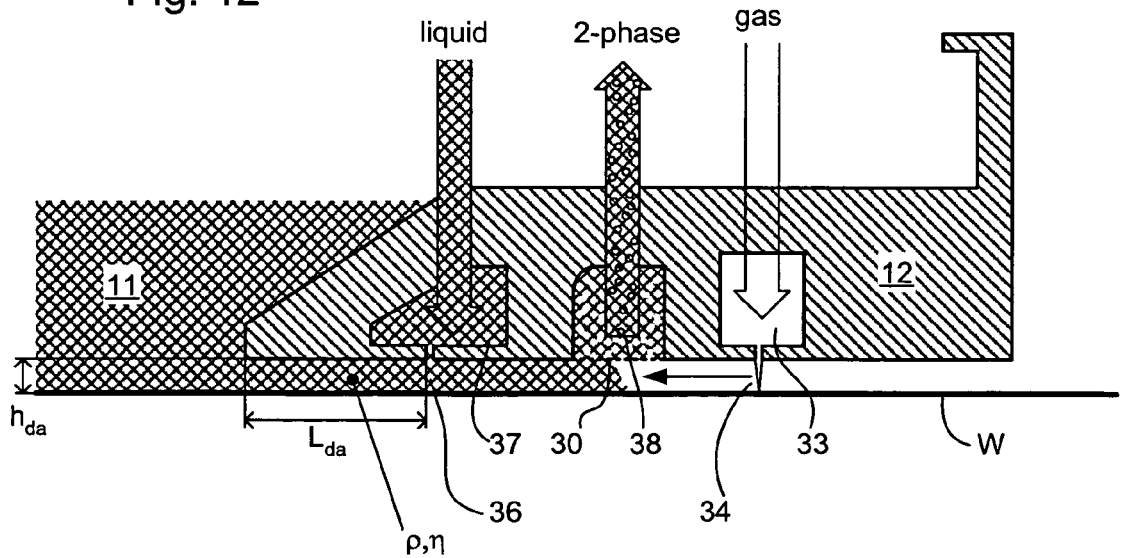
FIG. 12 depicts a liquid supply and removal system according to another particular embodiment of the invention.

A seal member according to another particular embodiment of the invention is shown in FIG. 12, which is a similar view to FIG. 8.

In the embodiment of FIG. 12, a liquid bearing 36 is used to at least partially support the seal member 12, in place of separate actuators. The liquid, or hydro-dynamic, bearing 36 is formed by immersion liquid supplied under pressure to liquid supply chamber 37, in a known manner. The liquid is removed via two-phase extraction chamber 38, which is connected to suitable pumps (not shown) capable of handling the two-phase flow. A gas knife 34 confines the immersion liquid in the same manner as in previous embodiments.

The use of a liquid bearing 36 enables the seal member 12 to be maintained at a height of about 50 to 200 µm above the substrate W or substrate table WT, easing control and flatness requirements as described above. At the same time, the two-phase extraction reduces the number of chambers that need to be formed in the seal member 12 and the number of hoses that need to be provided to it.

A porous plate 30 is provided across the bottom of two-phase extraction chamber 38, to control the flow of gas and liquid into it. By suitable selection of the size, number and arrangement of the pores in this plate, the two-phase flow is made steady, avoiding uneven flow that may cause vibrations. As in the embodiments described above, a micro-sieve may be used as the plate 30.

Also as described in relation to the embodiment above, an inclination or a sharp edge may be provided in the porous plate 30 to control the position of the meniscus of the immersion liquid 11. Again, the removal of any residual liquid can be effected by a high-humidity, large flow gas knife 34 and the pressure of the gas knife can also be used to control the meniscus position.

In this, and other, embodiments of the invention, the shape of the part of the seal member that is in the immersion liquid may be adjusted to provide a desired degree of damping of vertical movements of the seal member 12. In particular, the width $L_{da}$, and hence area, of a part of the seal member which confines the liquid 11 into a narrow passage can be selected to provide the desired damping. The amount of damping will be determined by the area of the damping region, its height $h_{da}$ above the substrate W or substrate table WT, the density ρ of the immersion liquid and its viscosity η. Damping may reduce variations in the position of the seal member due to vibrations, e.g. caused by uneven fluid flows.

Figure 13:
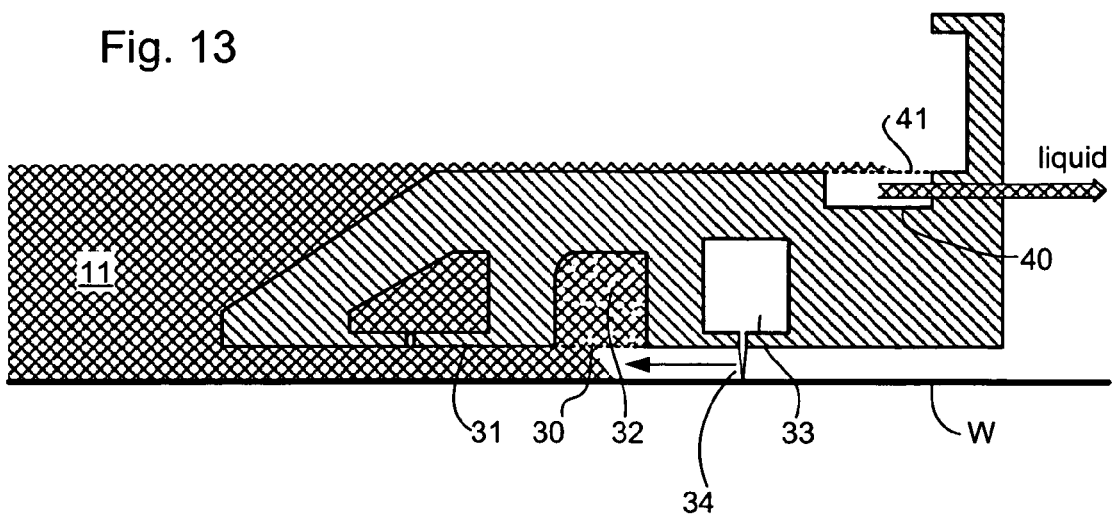
FIG. 13 depicts a variant of the liquid supply and removal system of FIG. 12.

A porous plate 41 may also be used to control the flow in an overflow drain 40, as shown in FIG. 13. The overflow drain of FIG. 13 may be applied in any of the embodiments of the invention described herein. The overflow drain is provided in an upper surface of the seal member 12 at a relatively large radius from the center of the seal member 12. In case the space between the final element of the projection system PL and the substrate W becomes overfull of immersion liquid, the excess liquid will flow onto the top of the seal member 12 and into the drain 40. The drain 40 is normally full of liquid and maintained at a slight underpressure. The porous plate 41 prevents gas being drawn into the overflow drain but allows liquid to be drained away when required. The porous plate may also be set at a slight angle to the horizontal.

Figure 14:
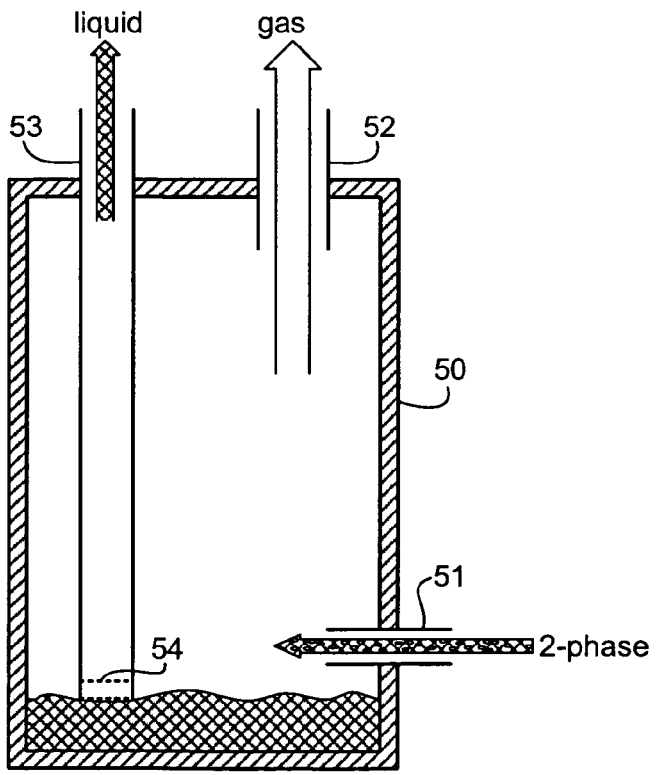
FIG. 14 depicts a manifold in a liquid removal system according to another particular embodiment of the invention.

A porous separator can also be used in a manifold 50 that is provided in a liquid drain system that takes a two-phase flow from the immersion hood IH. As shown in FIG. 14, the two-phase flow 51 is discharged into a manifold chamber 51 in which the liquid and gas separate. The gas is removed from the top of the manifold by a gas outlet 52 which is kept at a pressure of about −0.1 barg by a suitable vacuum pump and pressure controller. A liquid removal pipe 53 extends to near the bottom of the manifold and is closed by a porous plate 54. The liquid removal pipe 53 is kept at a pressure below the bubble point of the porous plate 54, e.g. about −0.5 barg, With this arrangement, even if the liquid level in the manifold drops below the bottom of the pipe 53, no gas will be drawn in to it, preventing any unwanted fluctuation in the pressure of the manifold 50, which might be communicated back to the immersion hood IH and cause a disturbance.

Figure 15:
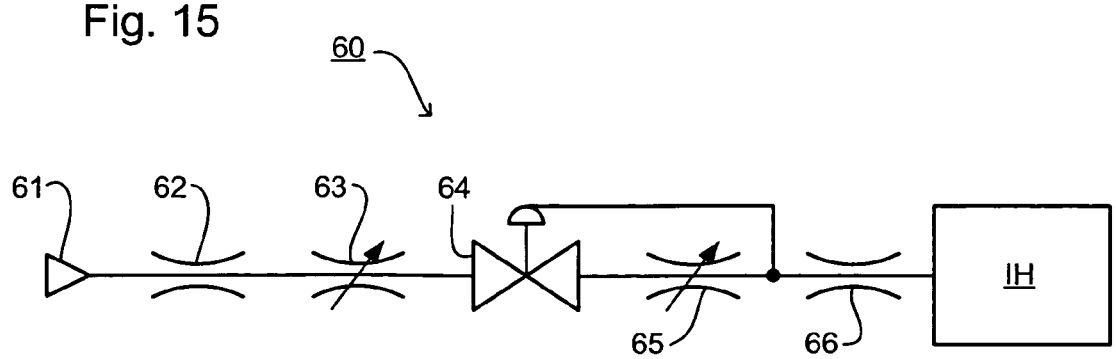
FIG. 15 depicts a liquid flow regulation system usable in embodiments of the invention.

A liquid supply system 60 that may be used in embodiments of the invention is shown in FIG. 15. It comprises, in series: a source 61 of immersion liquid, e.g. a fab supply of ultra pure liquid; a constant flow restrictor 62; a variable flow restrictor 63; and a pressure regulator 64 with an external tap, a variable restriction 65 and a constant restriction 66, positioned just before the immersion hood IH. The pilot line for the pressure regulator 64 is connected downstream of the variable restriction 65 and so the input to the constant restriction 66 is at a constant pressure, hence the flow into the immersion hood is at constant pressure and rate.

In a lithographic apparatus, a substrate is held on a substrate holder (often referred to as a pimple plate, burl plate or chuck), which comprises a flat plate of the same diameter as the substrate having a large number of small pimples or burls on its major surfaces. The substrate holder is placed in a recess in the substrate table (mirror block) and the substrate placed on top of the substrate holder. A vacuum is developed in the spaces between the substrate table and holder and between the holder and substrate so that the substrate and holder are clamped in place by atmospheric pressure above the substrate. The recess in the substrate table is necessarily slightly larger than the substrate holder and substrate to accommodate variations in substrate size and placement. There is therefore a narrow groove or trench around the edge of the substrate in which immersion liquid may collect. While there the liquid causes no harm but it may be blown out of the groove by a gas bearing or gas knife in the immersion hood. Droplets on the substrate or substrate table that result may cause bubbles when the liquid meniscus under the immersion hood meets them.

The substrate holder is generally made of a material having a low thermal coefficient of expansivity, such as Zerodur or ULE. Some such materials are porous and in that case the surface pores are filled in to prevent contaminants becoming trapped there. However, it is proposed to leave the surface pores unfilled around the edge of the substrate holder and/or in a peripheral region. Then, when the substrate holder is used in an immersion lithography apparatus, the immersion liquid entering the groove will enter the pores of the substrate holder and not be blown out by the gas bearing or gas knife. If the substrate holder has an open-celled structure, the immersion liquid that has entered its pores can be removed by the vacuum system that clamps the substrate and holder to the table.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above. The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used. However, it is to be understood that embodiments of the present invention may be used with other types of liquid in which case such water-related terms should be considered replaced by equivalent terms relating to the immersion liquid used.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate using a projection system and having a liquid supply system arranged to supply a liquid to a space between the projection system and the substrate, comprising a liquid removal system including:
   a conduit having an open end adjacent a volume in which liquid will be present;
   a porous member between the end of the conduit and the volume, wherein the porous member is angled relative to an opposing surface of a substrate table, or an opposing surface of the substrate when on the substrate table, or both opposing surfaces, such that a portion of a surface of the porous member is closer, in use, to the opposing surface than another portion of the surface of the porous member located radially outwardly of the portion closer to the opposing surface; and
   a suction device arranged to create a pressure differential across the porous member.

2. The apparatus according to claim 1, wherein the liquid removal system is arranged to remove liquid from a volume adjacent the space.

3. The apparatus according to claim 2, further comprising a member at least partially surrounding the space and wherein the conduit comprises a recess in a surface of the member facing the substrate table and/or the substrate when on the substrate table, the porous member closing the recess.

4. The apparatus according to claim 3, wherein the member forms a closed loop around the space and the recess extends around the whole of the member.

5. The apparatus according to claim 3, wherein the member further comprises a gas supply circuit having an outlet in a surface facing the substrate table and/or the substrate when on the substrate table so as to form a gas knife to remove residual liquid from a surface of the substrate table and/or the substrate, the gas knife being located radially outwardly of the recess.

6. The apparatus according to claim 5, wherein the member further comprises a gas extraction circuit having an inlet located between the recess and the gas knife.

7. The apparatus according to claim 5, wherein the member further comprises a gas extraction circuit having an inlet located radially outwardly of the gas knife.

8. The apparatus according to claim 3, wherein the member further comprises a liquid supply circuit having an outlet in a surface facing the substrate table and/or the substrate when on the substrate table so as to form a liquid bearing to at least partly support the weight of the member, the liquid bearing being located radially inwardly of the recess.

9. The apparatus according to claim 3, wherein, during use, the member is supported at a height above the substrate in the range of from 50 to 300 μm.

10. The apparatus according to claim 1, further comprising a member at least partially surrounding the space and wherein the conduit comprises a recess in a surface of the member facing away from the substrate table and/or the substrate when on the substrate table, a porous member closing the recess.

11. The apparatus according to claim 1, wherein the liquid removal system comprises a liquid/gas separation manifold and the conduit comprises a pipe extending into a lower part of the manifold.

12. The apparatus according to claim 1, wherein the porous member has pores having a diameter in the range of from 5 to 50 μm.

13. The apparatus according to claim 1, wherein the porous member is hydrophilic.

14. A device manufacturing method, comprising:
   projecting a patterned beam of radiation through a liquid onto a substrate using a projection system; and
   removing liquid from a volume by providing a pressure differential across a porous member bounding at least in part the volume, wherein the porous member is angled relative to an opposing surface of a substrate table, an opposing surface of the substrate when on the substrate table, or both opposing surfaces, such that a portion of a surface of the porous member is closer, in use, to the opposing surface than another portion of the surface of the porous member located radially outwardly of the portion closer to the opposing surface.

15. The method according to claim 14, wherein the volume is adjacent a space comprising the liquid through which the patterned beam is projected.

16. The method according to claim 15, comprising removing the liquid from the volume using a recess in a surface, facing the substrate table and/or the substrate when on the substrate table, of a member at least partially surrounding the space, the porous member closing the recess.

17. The method according to claim 16, wherein the member forms a closed loop around the space and the recess extends around the whole of the member.

18. The method according to claim 16, further comprising supplying gas from a surface facing the substrate table and/or the substrate when on the substrate table so as to form a gas knife to remove residual liquid from a surface of the substrate table and/or the substrate, the gas being supplied at a position radially outwardly of the recess.

19. The method according to claim 18, further comprising removing gas from a position between the recess and the position where the gas is being supplied.

20. The method according to claim 18, further comprising removing gas from a position located radially outwardly of the position where the gas is being supplied.

21. The method according to claim 16, further comprising supplying liquid from a surface facing the substrate table and/or the substrate when on the substrate table so as to form a liquid bearing to at least partly support the weight of the member, the liquid being supplied at a position radially inwardly of the recess.

22. The method according to claim 16, comprising supporting the member at a height above the substrate in the range of from 50 to 300 μm.

23. The method according to claim 14, comprising removing the liquid from the volume using a recess in a surface, facing away from the substrate table and/or the substrate when on the substrate table, of a member at least partially surrounding the space, a porous member closing the recess.

24. The method according to claim 14, comprising removing the liquid from the volume through a pipe extending into a lower part of a liquid/gas manifold comprising the volume.

25. The apparatus according to claim 1, wherein the porous member is angled so that, in use, a gap between the porous member and the opposing surface increases in a direction away from an exposure field.

26. The method according to claim 14, wherein the porous member is angled so that, in use, a gap between the porous member and the opposing surface increases in a direction away from an exposure field.

27. A lithographic projection apparatus arranged to project a pattern from a patterning device onto a substrate using a projection system and having a liquid supply system arranged to supply a liquid to a space between the projection system and the substrate, comprising a liquid removal system including:
 a conduit having an open end adjacent a volume in which liquid will be present;
 a porous member between the end of the conduit and the volume;
 a suction device arranged to create a pressure differential across the porous member; and
 a gas supply circuit having an outlet in a surface facing a substrate table, facing the substrate when held by the substrate table, or facing both, so as to form a gas knife to remove residual liquid from a surface of the substrate and/or substrate table.

28. The apparatus according to claim 27, further comprising an outlet in a surface facing the substrate table and/or the substrate when on the substrate table, the outlet configured to supply liquid radially inwardly of the porous member.

29. The apparatus according to claim 27, further comprising a member at least partially surrounding the space and wherein the conduit comprises a recess in a surface of the member facing away from the substrate table and/or the substrate when on the substrate table, a porous member closing the recess.

30. The apparatus according to claim 27, further comprising a gas extraction circuit having an inlet located in a surface facing the substrate table and/or the substrate when on the substrate table to remove gas from the gas knife.

31. The apparatus according to claim 30, wherein the inlet is located between the porous member and the outlet.

32. A device manufacturing method, comprising:
 projecting a patterned beam of radiation through a liquid onto a substrate using a projection system;
 removing liquid from a volume by providing a pressure differential across a porous member bounding at least in part the volume; and
 supplying gas from a surface facing the substrate, facing a substrate table holding the substrate, or facing both, so as to form a gas knife to remove residual liquid from a surface of the substrate, or the substrate table, or both.

33. The method according to claim 32, further comprising supplying liquid from a surface facing the substrate table and or the substrate when on the substrate table, the liquid being supplied at a position radially inwardly of the porous member.

34. The method according to claim 32, comprising removing the liquid from the volume using a recess in a surface, facing away from the substrate table and/or the substrate when on the substrate table, of a member at least partially surrounding the space, a porous member closing the recess.

35. The method according to claim 32, further comprising removing gas from the gas knife through an inlet in a surface facing the substrate table and/or the substrate when on the substrate table.

36. The method according to claim 35, wherein the inlet is located between the porous member and the gas knife.

37. A lithographic projection apparatus arranged to project a pattern from a patterning device onto a substrate using a projection system and having a liquid supply system arranged to supply a liquid to a space between the projection system and the substrate, comprising a liquid removal system including:
 a conduit having an open end adjacent a volume in which liquid will be present;
 a porous member between the end of the conduit and the volume, wherein surfaces of the porous member forming a sharp corner or edge are exposed to fluid; and
 a suction device arranged to create a pressure differential across the porous member.

38. The apparatus according to claim 37, wherein the sharp corner or edge is configured to limit a position of a meniscus of the liquid.

39. The apparatus according to claim 37, wherein the sharp corner or edge is equal to or greater than 90 degrees.

40. The apparatus according to claim 37, wherein the member further comprises a liquid supply circuit having an outlet in a surface facing a substrate table and/or the substrate when on the substrate table, the outlet configured to supply liquid radially inwardly of the porous member.

41. The apparatus according to claim 37, wherein, during use, the member is supported at a height above the substrate in the range of from 50 to 300 μm.

42. The apparatus according to claim 37, wherein the porous member has pores having a diameter in the range of from 5 to 50 μm.

* * * * *

UNITED STATES PATENT AND TRADEMARK OFFICE
CERTIFICATE OF CORRECTION

| | | |
|---|---|---|
| PATENT NO. | : 7,701,550 B2 | Page 1 of 1 |
| APPLICATION NO. | : 10/921348 | |
| DATED | : April 20, 2010 | |
| INVENTOR(S) | : Kemper et al. | |

It is certified that error appears in the above-identified patent and that said Letters Patent is hereby corrected as shown below:

On the title page,
Item (56) References Cited, U.S. PATENT DOCUMENTS: Insert the following erroneously omitted
U.S. Patent Reference:

--5,207,915    5/1993    Hagen et al. ........ 210/635--

Signed and Sealed this
Thirteenth Day of March, 2012

David J. Kappos
*Director of the United States Patent and Trademark Office*